United States Patent
Zelner et al.

(12)

(10) Patent No.: US 11,274,363 B2
(45) Date of Patent: Mar. 15, 2022

(54) METHOD OF FORMING A SPUTTERING TARGET

(71) Applicant: NXP USA, Inc., Austin, TX (US)

(72) Inventors: Marina Zelner, Burlington (CA); Andrew Vladimir Claude Cervin, Oakville (CA)

(73) Assignee: NXP USA, Inc., Austin, TX (US)

(*) Notice: Subject to any disclaimer, the term of this patent is extended or adjusted under 35 U.S.C. 154(b) by 147 days.

(21) Appl. No.: 16/391,042

(22) Filed: Apr. 22, 2019

(65) Prior Publication Data

US 2020/0332411 A1 Oct. 22, 2020

(51) Int. Cl.
*C23C 14/34* (2006.01)
*C23C 14/08* (2006.01)
*H01G 7/00* (2006.01)

(52) U.S. Cl.
CPC ........ *C23C 14/3414* (2013.01); *C23C 14/088* (2013.01); *H01G 7/00* (2013.01)

(58) Field of Classification Search
CPC ...... C23C 14/3414; C23C 14/088; H01G 7/00
See application file for complete search history.

(56) References Cited

U.S. PATENT DOCUMENTS

| | | | | |
|---|---|---|---|---|
| 2,538,992 A | * | 1/1951 | Trask | C25C 1/06 420/8 |
| 5,164,104 A | * | 11/1992 | Kobayashi | C04B 35/58042 252/62.53 |
| 5,460,793 A | * | 10/1995 | Kano | C04B 35/58085 204/298.12 |
| 5,480,532 A | * | 1/1996 | Schlott | C04B 35/01 204/298.13 |
| 5,993,734 A | * | 11/1999 | Snowman | B22F 3/14 419/48 |
| 6,210,545 B1 | * | 4/2001 | Farooq | C04B 35/462 204/192.15 |
| 6,562,715 B1 | | 5/2003 | Chen et al. | |

(Continued)

FOREIGN PATENT DOCUMENTS

| | | |
|---|---|---|
| CA | 2010558 C | 4/1994 |
| CN | 101434408 A | 5/2009 |
| JP | H10330928 A * | 12/1998 |

OTHER PUBLICATIONS

JPH10330928A Translation (Year: 1998).*

(Continued)

*Primary Examiner* — James Lin
*Assistant Examiner* — Patrick S Ott

(57) ABSTRACT

Aspects of the subject disclosure may include, for example, a method in which a selection is made for a first major constituent, a second major constituent and a minor constituent for forming a desired material. The method can include mixing the first major constituent, the second major constituent and the minor constituent in a single mixing step to provide a mixture of constituents. The method can include drying the mixture of constituents to provide a dried mixture of constituents and calcining the dried mixture of constituents to provide a calcinated mixture of constituents. The method can include processing the calcinated mixture of constituents (by a process including vacuum annealing and hot-pressing) to provide a sputtering target. Other embodiments are disclosed.

20 Claims, 8 Drawing Sheets

(56) References Cited

U.S. PATENT DOCUMENTS

| | | | |
|---|---|---|---|
| 6,585,951 B1 | 7/2003 | Hong et al. | |
| 6,683,516 B2 | 1/2004 | Chiu et al. | |
| 6,774,077 B2 | 8/2004 | Sengupta et al. | |
| 6,876,279 B2 | 4/2005 | Sengupta et al. | |
| 6,905,989 B2 | 6/2005 | Ellis et al. | |
| 7,224,040 B2 | 5/2007 | Koutsaroff et al. | |
| 7,297,650 B2 | 11/2007 | Chiu et al. | |
| 7,909,949 B2* | 3/2011 | Nakamura | C23C 14/3407 |
| | | | 148/557 |
| 8,154,850 B2 | 4/2012 | Zelner et al. | |
| 8,192,648 B2* | 6/2012 | Straboni | H01L 31/03529 |
| | | | 252/500 |
| 8,194,837 B1 | 6/2012 | Weinman | |
| 9,404,175 B2* | 8/2016 | Zelner | C23C 14/3414 |
| 2003/0073565 A1 | 4/2003 | Ellis et al. | |
| 2003/0119656 A1 | 6/2003 | Chiu et al. | |
| 2004/0228968 A1 | 11/2004 | Basceri | |
| 2005/0118052 A1* | 6/2005 | Aimone | B22F 3/1003 |
| | | | 419/36 |
| 2006/0159950 A1 | 7/2006 | Kunisada et al. | |
| 2006/0246725 A1* | 11/2006 | Yeoh | H01L 21/76877 |
| | | | 438/692 |
| 2007/0093059 A1 | 4/2007 | Basol et al. | |
| 2007/0117237 A1 | 5/2007 | Inoue et al. | |
| 2007/0144573 A1 | 6/2007 | Mihara et al. | |
| 2008/0087866 A1* | 4/2008 | Wu | C04B 35/46 |
| | | | 252/500 |
| 2008/0152530 A1 | 6/2008 | Yu et al. | |
| 2008/0187453 A1* | 8/2008 | Schultheis | C22C 32/0026 |
| | | | 419/19 |
| 2009/0121199 A1 | 5/2009 | Inoue et al. | |
| 2010/0221508 A1* | 9/2010 | Huang | G03F 7/0042 |
| | | | 428/195.1 |
| 2011/0114481 A1* | 5/2011 | Satoh | C23C 14/08 |
| | | | 204/298.13 |
| 2011/0212382 A1 | 9/2011 | Randall et al. | |
| 2011/0250126 A1 | 10/2011 | Ivanov et al. | |
| 2012/0147524 A1 | 6/2012 | Okamoto et al. | |
| 2012/0251714 A1 | 10/2012 | Miller et al. | |
| 2012/0305392 A1* | 12/2012 | Kim | C23C 14/08 |
| | | | 204/298.13 |
| 2013/0240033 A1* | 9/2013 | Jeon | C25D 13/12 |
| | | | 136/256 |
| 2015/0171465 A1* | 6/2015 | Chao | H01M 10/0562 |
| | | | 429/322 |
| 2017/0342321 A1* | 11/2017 | Aoyagi | C09K 11/883 |

OTHER PUBLICATIONS

Final OA dated Nov. 5, 15 for U.S. Appl. No. 13/757,999, filed Nov. 5, 2015, 8 pages.
Non-Final OA mailed Jun. 19, 2015 for U.S. Appl. No. 13/757,999, filed Jun. 19, 2015, 15 pages.
Restriction Requirement dated Mar. 27, 2015 for U.S. Appl. No. 13/757,999, dated Mar. 27, 2015, 5 pages.
U.S. Appl. No. 13/757,999; Notice of Allowance; dated Mar. 14, 2016; 9 pages.
Kim et Al, "Effects of Nb and Sr doping on crystal structure of epitaxial BaTiO 3 thin films on MgO substrates Effect of oxygen content on the dielectricand ferroelectricproperties of BaTiO3 thin films Effects of Nb and Sr doping on crystal structure of epitaxial BaTiO 3 thin films on MgO substrates", J. Phys. D: Appl. Phys. J. Phys. D: Appl. Phys, (Jun. 18, 2002), Jun. 18, 2002, pp. 1499-1503.
The 2017 Clarivate document for Application No. 2009-J80705, published May 20, 2009, 2 pages.
Sung-Soo Ryu et al: "Solid-state synthesis of nano-sized BaTiO3 powder with high tetragonality", Journal of Materials Science, Kluwer Academic Publishers, BO, vol. 42, No. 17, May 5, 2007, pp. 7093-7099.

* cited by examiner (Including U.S. Patent No. 9,404,175)

METHOD OF FORMING A SPUTTERING TARGET

CROSS-REFERENCE TO RELATED APPLICATION(S)

This application is related to prior art U.S. Pat. No. 9,404,175, issued on Aug. 2, 2016, to Zelner et al., which is incorporated herein by reference.

FIELD OF THE DISCLOSURE

The subject disclosure relates to a method of forming and utilizing sputtering targets.

BACKGROUND

Dielectric thin films can be deposited for the purpose of fabricating electronic components by a variety of methods. One of these methods is physical vapor deposition (PVD) from a target of the desired material, otherwise known as sputtering. The sputtering method is known to people skilled in the art of thin-film deposition for the deposition of the conductive or semiconducting films (metals or conductive barriers). The method could be utilized also for the deposition of dielectrics. The sputtering process can utilize cathode plasma discharge in vacuum resulting in the material transfer from the target to a substrate. The deposition can be done in an inert plasma sustaining gas ambient or in a reactive gas ambient, such as an inert/reactive gas mixture. Argon is frequently used as the inert plasma sustaining gas. Oxygen is a frequently used reactive gas for the deposition of oxide films. Other reactive gases such as nitrogen, nitrous oxide, etc. can be used as well. The quality of the thin dielectric film is heavily dependent on the quality and structure of the target material. Any impurities or trapped gases in the target are incorporated into the thin film, usually causing degradation of the film performance. The rate at which material is ejected from the target is also influenced by the target composition and density. A denser target can withstand higher power and have a resulting higher deposition rate and higher productivity of the fabrication process. Thus, the target quality and density will determine the film quality and productivity of the process. One of the challenges in fabrication of the target with a doped composition is the fact that the minor constituents (dopants) are added in substantially lower amounts (~0.5-10% of the major constituents). If the dopants are not evenly distributed, they create local areas with different dielectric strength and density. If the dopants have multiple valent states, the uneven distribution of dopants will lead to generation of large pores, craters, or even blisters. Even distribution of the minor constituents in the composition is a key to the dielectric strength of the target, particulate control, and deposition rate of the sputtering process. Attempting to improve the distribution of the minor constituents by longer mechanical mixing/milling step results in micro-contamination of the target material with trace elements worn off the contacting parts.

Referring now to FIG. 1, certain conventional sputtering target production techniques will be described in connection with influence of a selected pressing method. In this regard, dielectric powder 102 is shown. This dielectric powder 102 is fabricated via calcination of mixed precursors in oxygen in an atmospheric pressure furnace (see step 530 of FIG. 5 of the present application). Further, a semiconducting target 104 can be produced (see arrow "A" of this FIG. 1) by hot pressing in a vacuum (see step 550 of FIG. 5 of the present application). That is, this initially insulating oxide material 104 is reduced in vacuum and at T to the sub-oxide state (oxygen-poor, electrically semiconducting).

Still referring to FIG. 1, in another conventional process (see arrow "B" of this FIG. 1), an insulating target 106 is produced by a Cold Isostatic Press (CIP) process. The insulating target 106 has the same chemical composition as the dielectric powder 102. This resulting cold pressed semiconducting target 106 is, for example, 65-85% dense).

Reference will now be made to FIG. 2. As shown in FIG. 2, and as discussed above, the semiconducting target 104' (see, also, target cross-section 150) according to an implementation of prior art U.S. Pat. No. 9,404,175 is fabricated by the hot pressing of the dielectric powder 102' prepared by calcination (see step 530 of FIG. 5 of the present application) of precursors in oxygen (atmospheric furnace). Further, chemical reaction of the reduction of oxide powder into the semiconducting sub-oxide occurs in the hot press at T>900° C. (see step 550 of FIG. 5 of the present application). Simultaneously, mechanical pressure is densifying material (see, again, step 550 of FIG. 5 of the present application). Very often, oxygen is "locked" in the inner volume of material (see the non-uniformity of the cross-section of semiconducting target 150 showing darker-shaded (denser and more electrically conductive) outer layers 150A, 150B and lighter-shaded (less dense and more electrically resistive) inner portion 150C). This semiconducting target 150 has non-uniform composition across its thickness after bad press, and is 98.8% dense (low).

Reference will now be made to FIG. 5 (which essentially corresponds to FIG. 3 of prior art U.S. Pat. No. 9,404,175). In this FIG. 5, a method 500 is illustrated for fabricating a powder and forming a sputtering target from the powder. Method 500 can be utilized for forming a sputtering target (e.g., 104 of FIG. 1, 104' of FIG. 2, 150 of FIG. 2) and can be utilized for forming other sputtering targets that can be composed of various materials including BST, other titanates, and so forth.

Method 500 can include mixing of various components (see 512, 514, 516) at 510. In the example of method 500, two major constituents and one minor constituent are being selected to form a powder that can be hot-pressed into a sputtering target for PVD deposition of a high K dielectric thin film.

Still referring to FIG. 5, at 520, the mixture of constituents can be dried. The particular drying temperature (e.g., 130° C.) and drying time (e.g., 6 hrs) can vary and can be selected based on the constituents that have been mixed together, the batch size, and the equipment used. At 530, the dried mixture of constituents can be calcinated. The particular calcination temperature (e.g., (1200° C.) and calcination time (e.g., 12 hrs) can vary and can be selected based on the constituents that have been mixed together and the desired sputtering target, such as a BST sputtering target.

Still referring to FIG. 5, at 540, the reacted mixture of constituents can be further processed to obtain the desired powder that will form the sputtering target. For example, the reacted mixture of constituents can be pulverized and separated (e.g., via a sieve separation technique).

Still referring to FIG. 5, at 550, a sputtering target can be formed from the powder using a hot-press method. The temperature, pressure and duration of the hot-press method can vary and can be based on the powder and/or the desired sputtering target to be formed. For example, a BST sputtering target can undergo a hot-press at a temperature of 1000° C. to 2000° C.

As described herein, certain conventional techniques provide for oxide films of high quality that can be deposited using RF-magnetron sputtering from the dielectric targets. These sputtering rates are typically very low (at the range of 0.1-1 A/s). Other conventional techniques provide for DC-magnetron or superimposed P1 DC/RF or DC/RF sputter deposition that has much higher deposition rates. Still other conventional techniques that provide for advanced processes using DC bias on the cathode require low resistance semiconducting targets such as 10 Ohm-m or less. In prior art U.S. Pat. No. 9,404,175, a hot press technology is used to reduce the resistance of dielectric materials by oxygen depletion during high-T process in vacuum. In this regard, prior art U.S. Pat. No. 9,404,175 facilitated uniform dopant distribution in the powder for the target preparation. However, even utilizing various implementations of prior art U.S. Pat. No. 9,404,175, achieving uniform physical density and a uniform degree of oxygen depletion is still a challenge.

Referring now to FIG. 4C, depicted is a view of catastrophic failure of a semiconducting BST target 402 according to an implementation of prior art U.S. Pat. No. 9,404,175. In this FIG., a circular erosion line 404 is shown. The depth of the erosion line 404 (sometimes referred to herein as racetrack or erosion trench) shows the thickness of the high-density/low resistance crust. In the example shown in this FIG., the target 402 was running with no issues until it reached to the depth where the material resistance was too high, and the density was too low to provide desired electrical resistance.

BRIEF DESCRIPTION OF THE DRAWINGS

Reference will now be made to the accompanying drawings, which are not necessarily drawn to scale, and wherein:

FIG. 2 depicts a typical problem of a target fabricated according to an implementation of prior art U.S. Pat. No. 9,404,175—cross-sectional non-uniformity of the electrical resistance and density. In this FIG., the lighter (central) material of target 150 is less dense (d<99%) and more electrically resistant.

FIG. 3 shows that (according to an embodiment) the vacuum anneal prior to the hot press improves upon the cross-sectional non-uniformity of the electrical resistance and density described with reference to FIG. 2. In the embodiment of this FIG. 3, the powder (that is, the vacuum-annealed powder) was converted into the sub-oxide state. In this FIG. 3, the semiconducting target after the hot press was 99.7% dense.

FIGS. 4A and 4B show the difference in microstructure of the conventional hot-pressed target material of FIG. 4A (according to an implementation of prior art U.S. Pat. No. 9,404,175) as compared to the target material of FIG. 4B (according to an embodiment).

DETAILED DESCRIPTION

Various implementations according to prior art U.S. Pat. No. 9,404,175 can result in a low-yielding process in which a cross-sectional composition (of a sputtering target) has non-uniformity. Problems associated with such non-uniformity are: poor electrical strength of the target, variable deposition rate, arcing, and/or catastrophic target failure. The root cause of the non-uniformity is that the semiconducting state of the target material is achieved through the reductive conversion of the dielectric powder with the oxygen evolving and that a chemical reaction of conversion occurs simultaneously with the physical densification. This process of various implementations according to prior art U.S. Pat. No. 9,404,175 is solely dependent on variable (equipment design related) temperature ramp rate and vacuum pump throughput.

In contrast, various embodiments described herein provide a process that is more stable because such process separates the chemical reaction step from the physical densification. This is accomplished in various embodiments by adding a vacuum anneal step (during which chemical conversion of the oxide dielectric material into the sub-oxide semiconducting material occurs). The temperature of the vacuum anneal can be determined by DTA (Differential Thermal Analysis) by the max. weight loss peak related to oxygen depletion. In various embodiments, the method is applicable for both doped and undoped dielectric compositions including the High-K dielectrics (BST, PZT, PMN, PLZT, etc.) having more than one oxide component.

Figure 1:
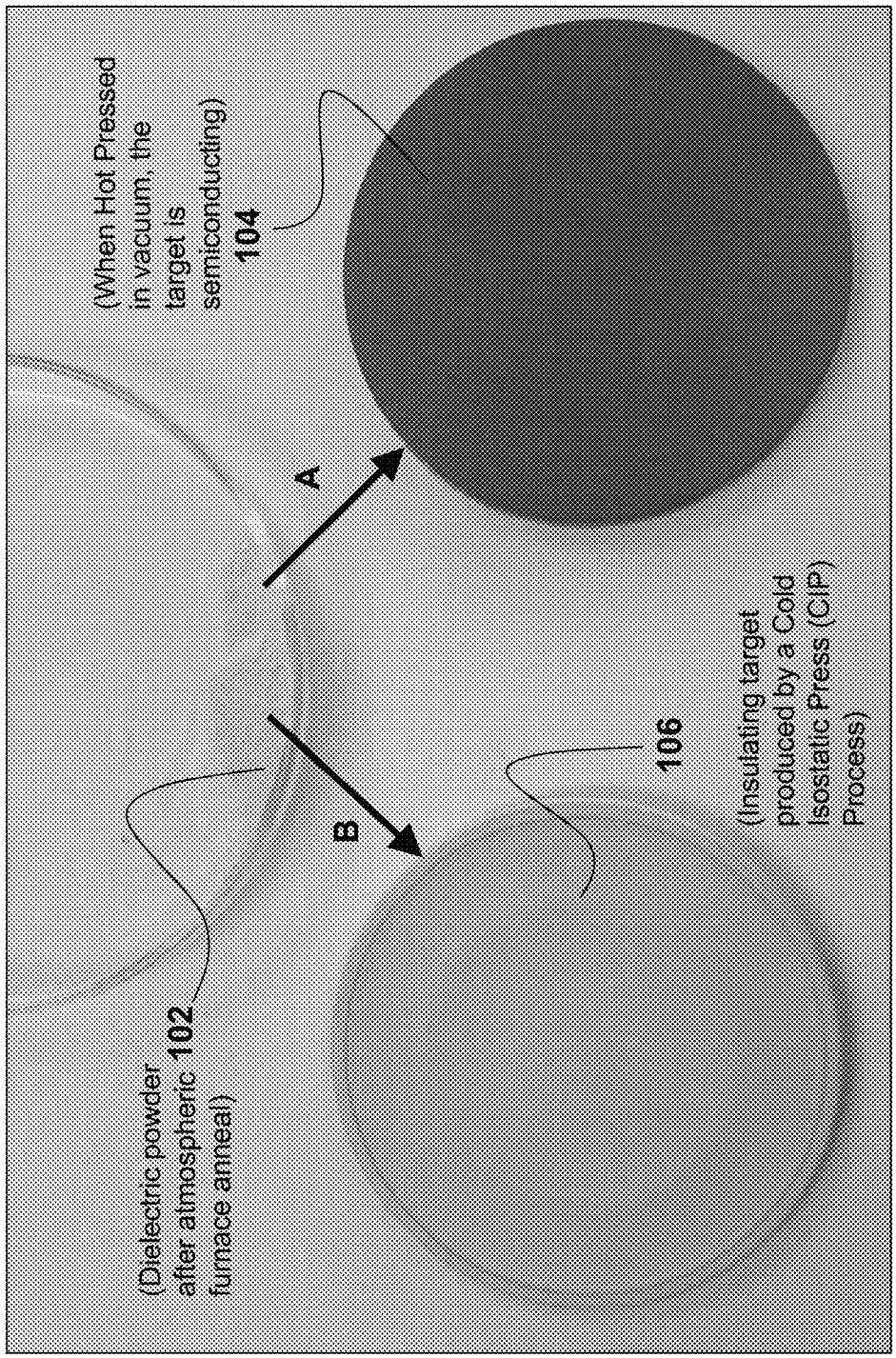
FIG. 1 depicts certain conventional sputtering targets and associated production techniques. The powder 102 and the resulting target 104 are produced (see arrow "A") by a process of prior art U.S. Pat. No. 9,404,175. Another conventional process (see arrow "B" from powder 102 to target 106) utilizes a Cold Isostatic Press (CIP) process.
Figure 2:
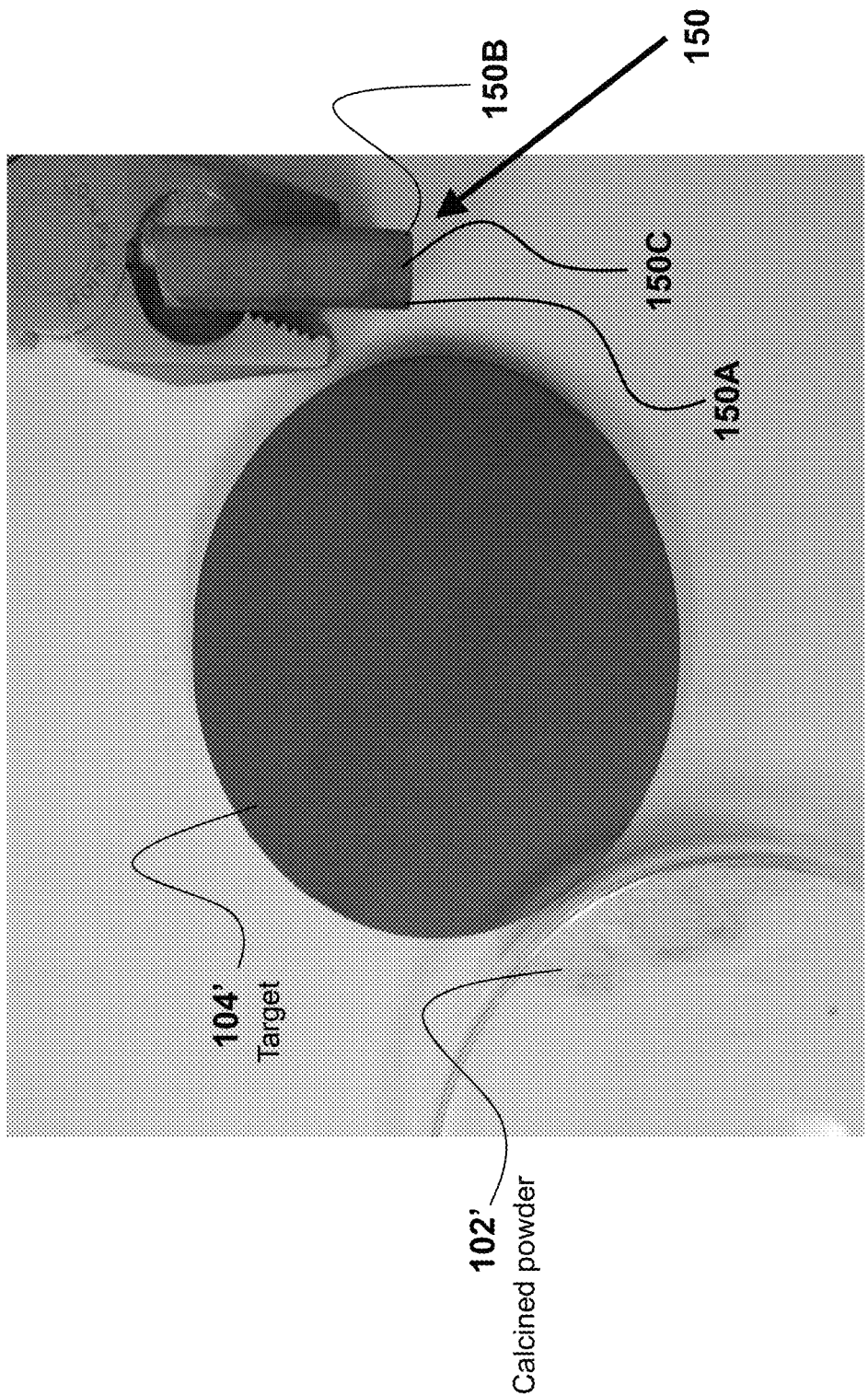
FIG. 2 depicts another view of a certain conventional dielectric powder 102' and semiconducting target 104' (according to prior art U.S. Pat. No. 9,404,175). Also shown in FIG. 2 is a portion (depicting a cross-section) of a semiconducting target 150 that is similar to targets 104, 104' (according to prior art U.S. Pat. No. 9,404,175). This
Figure 3:
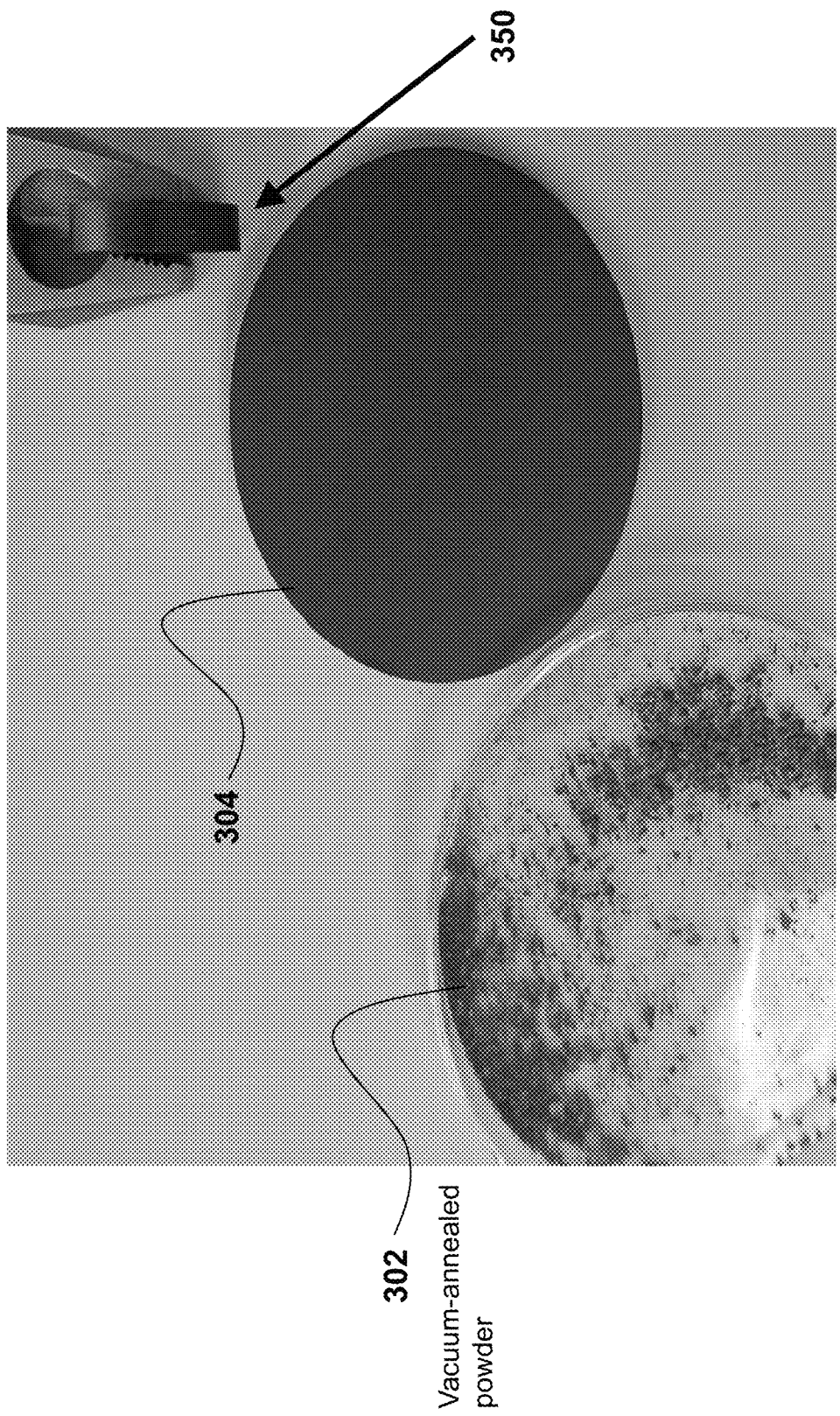
FIG. 3 depicts a vacuum-annealed powder 302 and semiconducting target 304 according to an embodiment. Also shown in FIG. 3 is a portion (depicting a cross-section) of a semiconducting target 350 according to an embodiment that is similar to target 304. This

Reference will now be made to FIG. 3. More particularly, this FIG. 3 shows (according to an embodiment) results of separation of chemical reaction from physical densification. The semiconducting powder is fabricated by the vacuum anneal of previously mixed and calcined precursors in the vacuum furnace. The vacuum-annealed powder is semiconducting (sub-oxide form). The subsequent hot press process preserves the sub-oxide state while physically densifying the target material at, for example, 1200-1500 C.

Figure 4A:
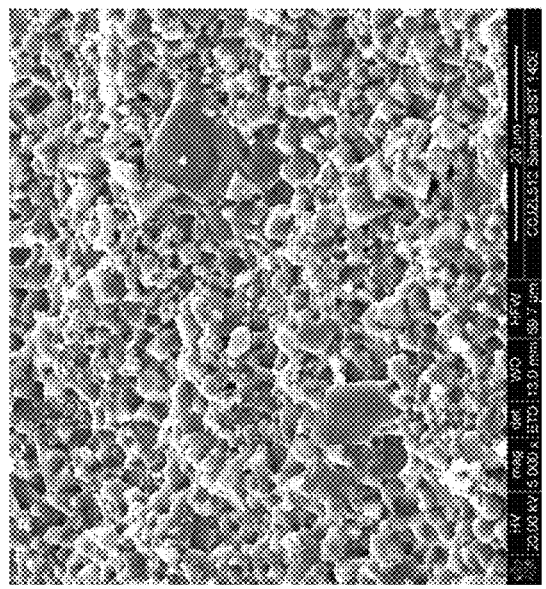
FIGS. 4A and 4B depict various FE SEM (Field Emission Scanning Electron Microscopy) micrographs showing grain size distributions.
Figure 4B:
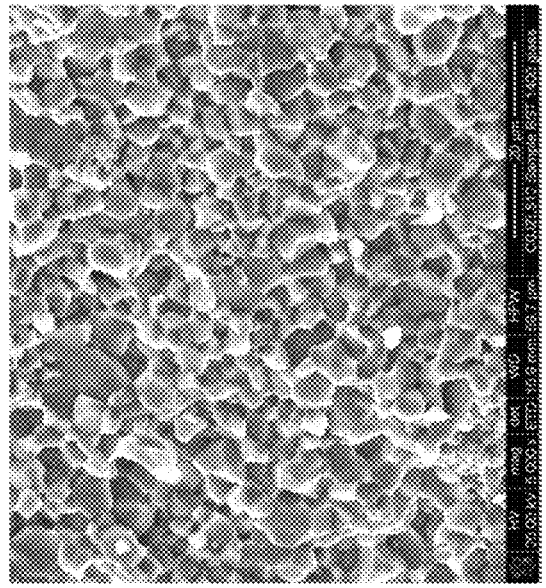
Figure 4C:
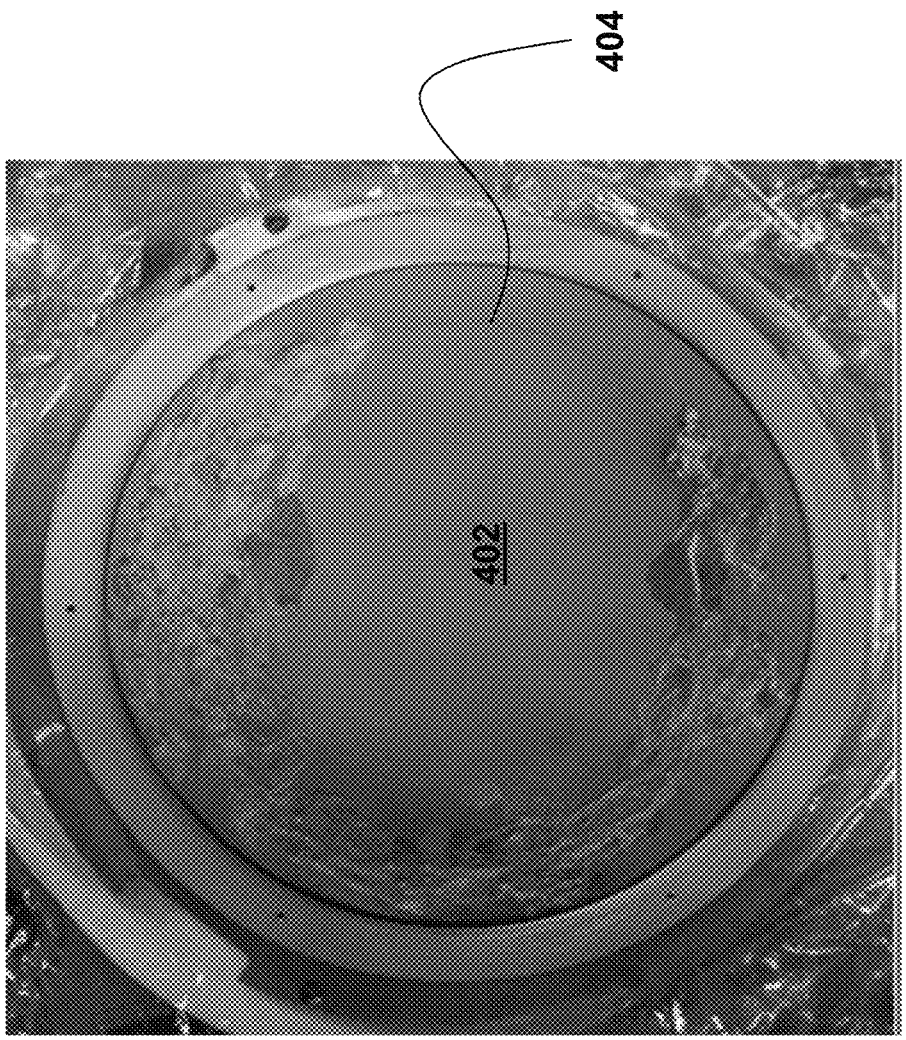
FIG. 4C depicts a view of catastrophic failure of a semiconducting BST target according to an implementation of prior art U.S. Pat. No. 9,404,175. The target was used in production for a while until it failed. The racetrack is the erosion trench developing during the normal target operation (in sputtering, the target material is not consumed uniformly). The presence of the racetrack proves that the target was operating normally until the racetrack dug into the depth where the target material was more resistive.
Figure 5:
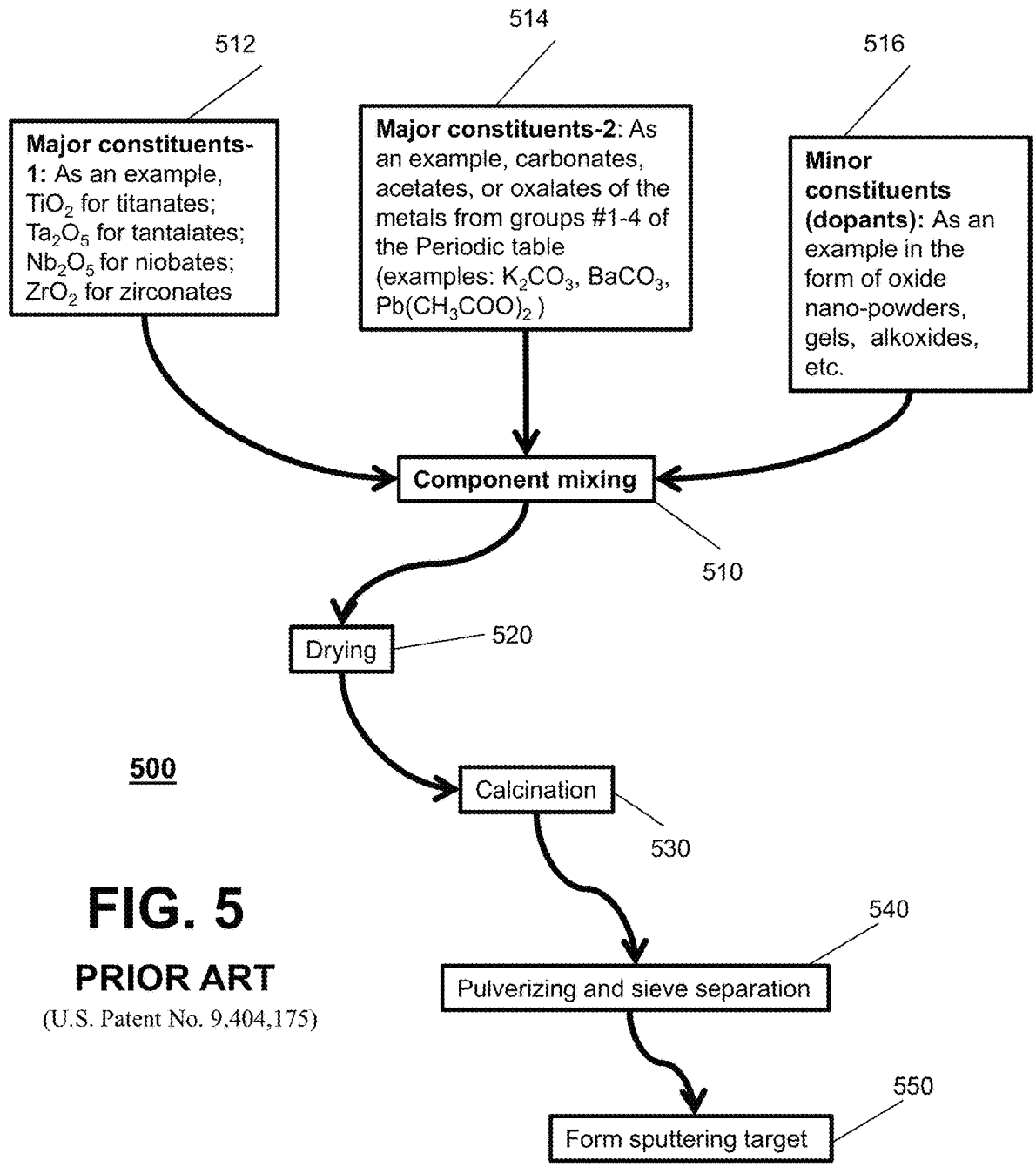
FIG. 5 depicts a method according to prior art U.S. Pat. No. 9,404,175 that can be used (for example) for fabricating the sputtering targets 104, 104' and 150 of FIGS. 1 and 2.

Referring now to FIG. 4A, it is seen that a process according to an implementation of prior art U.S. Pat. No. 9,404,175 with in-situ chemical reaction results in bi-modal grain size distribution with a visible porosity (result of restricted outgassing). In contrast, FIG. 4B shows (according to an embodiment) results of a process where the chemical reaction/oxygen depletion happens in a separate vacuum anneal (this FIG. 4B shows more uniform granularity as compared to FIG. 4A).

The subject disclosure describes, among other things, illustrative embodiments of a sputtering target and a method of forming the sputtering target to enable fabrication of desired electrical or optical components, such as components that include high-K dielectric thin film(s). In one or more embodiments, the composition includes major and minor constituents. In one or more embodiments, the sputtering target can be used in a PVD process that enables a higher deposition rate (e.g., greater than 9 nanometers per minute). In one or more embodiments, the sputtering target can have a higher density (e.g., at least 99% of the theoretical density). In one or more embodiments, the sputtering target can be used in a PVD process to form a BST layer, such as for use in a variable capacitor. In one or more embodiments, the process allows application of higher power to the target than previously possible with certain standard targets with a consequent increase in the productivity of the deposition process and therefore increased capacity and reduced manufacturing cost. In one or more embodiments, the process allows one mixing step to significantly reduce contamination from the mixing step in the final sputtering target.

Other references, such as U.S. Pat. Nos. 8,154,850, 8,194,837, 7,224,040 which are hereby incorporated by reference, have shown how to fabricate fixed and tunable capacitors using dielectric thin films deposited by the sputtering method. Electronic and optical devices other than capacitors can also be fabricated with dielectric films deposited by the sputtering method. Examples include, but are not limited to: non-volatile memories, film bulk acoustic resonators (FBAR) for filtering and signal processing, anti-reflection coatings for lenses and waveguides for integrated optics. Other references demonstrate the advantages of using doped oxide formulations in electronic devices: U.S. Pat. Nos. 6,683,516, 6,876,279, 6,774,077, 6,905,989, 7,297,650, which are hereby incorporated by reference.

In one or more embodiments, the precursors for forming the sputtering target, such as major and minor constituents, can be selected based on thermal decomposition properties. In one embodiment, some or all of the thermally decomposable precursors for the major constituents can be selected based on their material properties of being thermally decomposable at a temperature of equal to or lower than 60% of the final crystallization temperature of the fully oxidized dielectric composition (e.g., BST, PZT, etc. bulk ceramic). In one or more embodiments, thermal decomposition of such components can occur at an equal or lower temperature than the temperature of a solid state reaction forming the given composition.

In one or more embodiments, the minor constituents can be amorphous or near-amorphous, including nanopowders, gels, and/or alkoxides. In one or more embodiments, the major and minor constituents can be mixed in a single mixing step and then processed (e.g., drying, calcining, pulverizing, vacuum annealing, re-pulverizing, and sieve separating) so that a resulting powder can be hot-pressed to form a desired sputtering target. Other embodiments are contemplated by the subject disclosure.

One embodiment of the subject disclosure can be a method including selecting a first major constituent, a second major constituent and a minor constituent. The first major constituent can be selected from a group consisting essentially of $TiO_2$, $Ta_2O_5$, $Nb_2O_5$, or $ZrO_2$. The second major constituent can be selected from a group consisting essentially of a carbonate or a carboxylate (acetate, oxalate, formicate) or combination thereof. The minor constituent can be selected from a group consisting essentially of a nanopowder, a gel, an alkoxide or combinations thereof. The method can include mixing the first major constituent, the second major constituent and the minor constituent in a single mixing step to provide a mixture of constituents. The mixing could be dry or wet. The method can include drying the mixture of constituents to provide a dried mixture of constituents, and calcining the dried mixture of constituents to provide a fully reacted crystalline material of the given composition. The method can include pulverizing and sieve separating the reacted material to provide a precursor powder. The precursor powder can be vacuum annealed and then again pulverized/separated. The vacuum-annealed powder of the given composition and of the certain grain size can be a precursor material for the hot press formation of a sputtering target.

One embodiment of the subject disclosure can be a method that includes selecting a major constituent and a minor constituent. The major constituent can be selected from a group of major constituents that have a thermal decomposition temperature of 50% to 60% of the final crystallization temperature of a powder of constituents. The minor constituent can be selected from a group of minor constituents that are amorphous. The method can include mixing the major constituent and the minor constituent in a single mixing step to provide a mixture of constituents. In one example, the ratio of the main elements does not change from mixing to the target formation (in this example, oxygen is the only variable element). The method can include drying the mixture of constituents to provide a dried mixture of constituents, and calcining the dried mixture of constituents to provide a fully reacted mixture of constituents. The method can include milling or pulverizing the calcinated mixture of constituents to provide the insulating powder of constituents. The powder can then be vacuum annealed to a semiconducting sub-oxide state and then again pulverized/separated. The grain size distribution and thermal stability of this vacuum-annealed powder is configured for being hot-pressed to form a compositionally uniform and dense sputtering target.

One embodiment of the subject disclosure can be a method that includes selecting a first major constituent, a second major constituent and a minor constituent for forming a high-K dielectric material. The method can include mixing the first major constituent, the second major constituent and the minor constituent in a single mixing step to provide a mixture of constituents. The method can include drying the mixture of constituents to provide a dried mixture of constituents and calcining the dried mixture of constituents to provide a fully reacted mixture of constituents. The method can include milling or pulverizing the reacted mixture of constituents to provide a powder of constituents. The powder can then be vacuum annealed and then again pulverized/separated. The vacuum-annealed powder of constituents can be configured for being hot-pressed to form a sputtering target for use in a physical vapor deposition process to form the dielectric material at a deposition rate of at least twelve nanometers per minute.

In one or more embodiments, the sputtering target can be used to deposit films at between 9 and 18 nm/min. This can facilitate the deposition process with consequent cost reduction for the eventual product and capacity increase for the manufacturing facility.

A sputtering target can be formed through a process that selects particular precursor materials for forming a powder. The materials can be selected based on various criteria, including thermal decomposition properties, such as a particular thermal decomposition temperature (e.g., of <50-60% of the final crystallization temperature of the resulting fully oxidized dielectric composition (e.g., BST, PZT, etc. bulk ceramic)—although other thermal decomposition temperatures (or ranges of temperatures) can be utilized). Other criteria can include structure, such as amorphous or near amorphous structure of the precursor.

In one embodiment, all of the thermally decomposable precursors for the major constituents are thermally decomposable at a temperature of 50-60% of the final crystallization temperature of the fully oxidized dielectric composition (e.g., BST, PZT, etc. bulk ceramic). In another embodiment, the thermal decomposition of all of the decomposable precursors for the major constituents occurs at an equal or lower temperature than the temperature of the solid state reaction forming the major constituent(s). In one or more embodiments, more than one major constituent and at least one minor constituent is utilized in forming the sputtering target.

In one or more embodiments, the major constituent(s) for the sputtering target can include thermally decomposable precursor(s) of one or more of metal carbonates and carboxylates (such as oxalates or acetates). In one or more embodiments, the minor constituent(s) for the sputtering target can include liquids (such as sols, gels, and/or alkoxides) or solids (such as xero-gels, anhydrous amorphous precipitates, and/or nanopowders).

For example, nanopowder precursors for the minor constituents can include metal oxide nanopowders including rare-earth metal oxide, hydroxide, titanate, zirconate, and/or niobate nanopowders. As another example, sol-gel or gel chemically derived precursors for the minor constituents can include metal titanate, tantalite, niobate, zirconate sols and gels both in organic solvents or aqueous. As another example, alkoxides and partially hydrolyzed alkoxides for the minor constituents can include metal alkoxides such as (but not limited to) magnesium ethoxide, aluminum isopropoxide and/or rare-earth alkoxides. As another example, partially hydrolyzed alkoxides can also include hydroxyacetates, hydroxyoxalates or hydroxypropionates.

As another example, hydroxides for the minor constituents can include magnesium hydroxide, aluminum hydroxide, and so forth. As another example, carboxylates include acetates, formciates, oxalates or propionates (both hydrated and anhydrous). In one or more embodiments, any metal alkoxide (except of alkoxides of the group 1 metals) can be used in the partly hydrolyzed form.

In one or more embodiments, the major and minor constituents for sputtering target can be combined in a one-step mixing of all the precursors. A calcination can be performed at a temperature selected for the mixture that provides a desired grain size, such as a calcination temperature of 1200° C. for a BST powder. Other precursors and constituents can be used for forming sputtering targets which can result in other calcination temperatures being implemented, such as utilizing other titanate-based powders where a lower calcination temperature is utilized.

Figure 6:
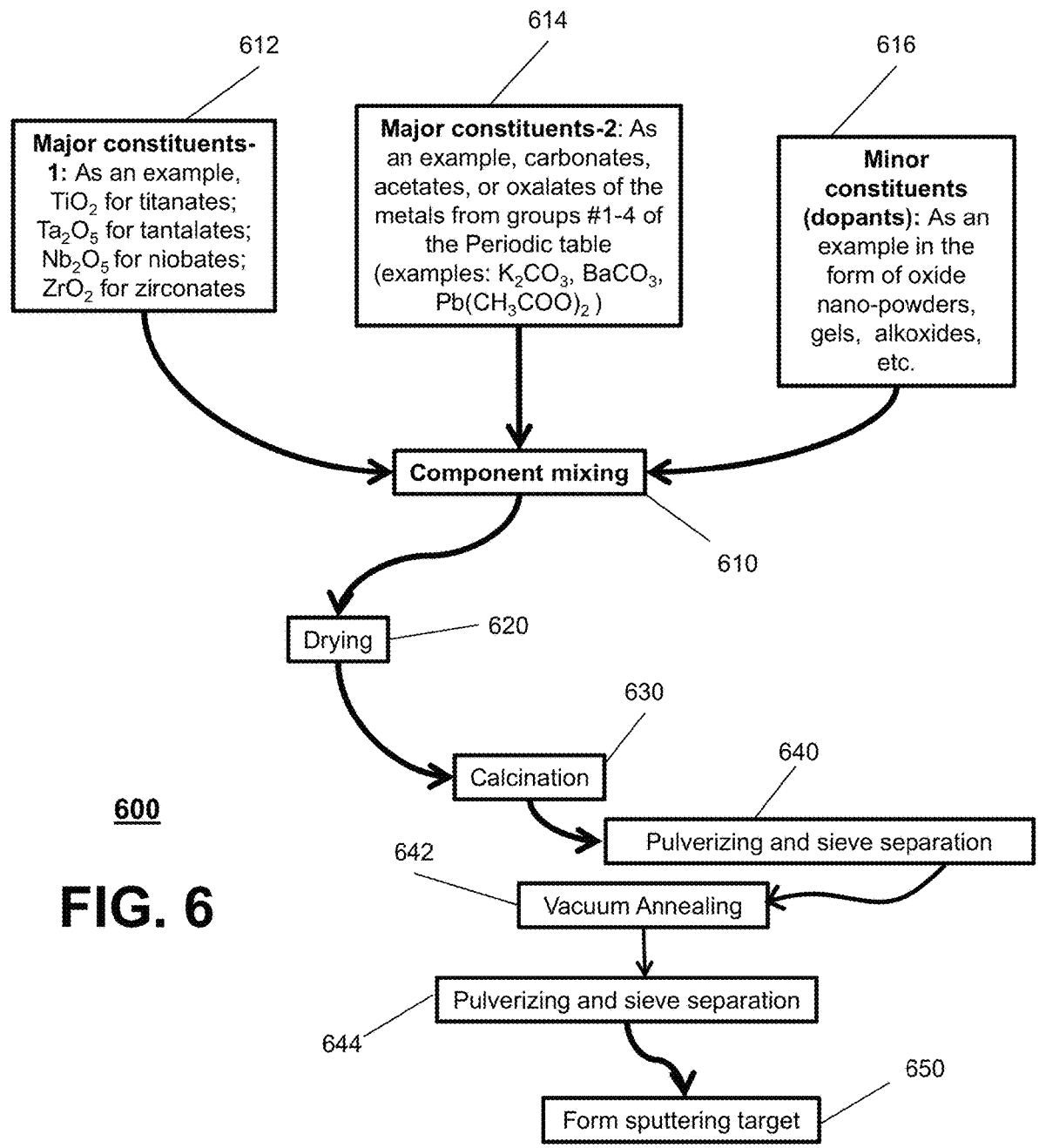
FIG. 6 depicts a method according to an embodiment that can be used (for example) for fabricating the sputtering targets 304 and 350 of FIG. 3.

Reference will now be made to FIG. 6, in which a method 600 (according to an embodiment) is illustrated for fabricating a powder and forming a sputtering target from the powder. Method 600 can be utilized for forming a sputtering target (e.g., 304 of FIG. 3) and can be utilized for forming other sputtering targets that can be composed of various materials including BST, other titanates, and so forth. Method 600 is not intended to be limited to the steps illustrated in FIG. 6 and can include more or less steps than is depicted.

Method 600 can include mixing of various components (see 612, 614, 616) at 610. The mixing can be a single mixing step and can be performed using various techniques including ball milling, vibrational milling and/or mechanical grinding, which may depend on the selected components. The components for mixing can be selected based on various criteria associated with the powder that will form the sputtering target. For example, the components can be selected based on thermal decomposition properties of one or more of the components, such as the thermal decomposition of a precursor of a major constituent satisfying a temperature threshold with respect to the crystallization temperature of the fully oxidized dielectric composition (e.g., BST, PZT, etc. bulk ceramic). In the example of method 600, two major constituents and one minor constituent are being selected to form a powder that can be hot-pressed into a sputtering target for PVD deposition of a high K dielectric thin film.

The particular number and types of major and minor constituents can vary depending on the sputtering target that is to be formed. In this example of method 600, the first major constituent can be $TiO_2$ for titanates, $Ta_2O_5$ for tantalates, $Nb_2O_5$ for niobates and $ZrO_2$ for zirconates. Continuing with this example, the second major constituent can be carbonates, acetates, or oxalates of the metals from groups number 1-4 of the Periodic table (e.g., $K_2CO_3$, $BaCO_3$, and/or $Pb(CH_3COO)_2$). The minor constituents for this example of method 300 can be in the form of oxide nanopowders, gels, alkoxides, and so forth. Other major and/or minor constituents can also be utilized, including the other examples described throughout the present disclosure.

In another example, pure Barium Titanate can be the only (single) constituent (in this example, there would be no constituent mixing). In another example, pure Strontium Titanate can be the only (single) constituent (in this example, there would be no constituent mixing). The Barium Titanate and/or Strontium Titanate could, for example, be prepared from commercially available powders. In another example, to achieve uniformity of resistance and density through the cross-section of the resulting target similar techniques as described herein in the context of a doped and/or multi-oxide composition may be used in connection with these single constituent examples.

Still referring to FIG. 6, at 620, the mixture of constituents can be dried. The particular drying temperature (e.g., 130° C.) and drying time (e.g., 6 hrs) can vary and can be selected based on the constituents that have been mixed together, the batch size, and the equipment used. At 630, the dried mixture of constituents can be calcinated (e.g., at a pressure of 97-105 kPa). The particular calcination temperature (e.g., 1200° C.) and calcination time (e.g., 12 hrs) can vary and can be selected based on the constituents that have been mixed together and the desired sputtering target, such as a BST sputtering target. In various embodiments described herein the term "calcination" means an atmospheric pressure anneal in presence of oxygen.

Still referring to FIG. 6, at 640, the reacted mixture of constituents can be further processed. For example, the reacted mixture of constituents can be pulverized and separated (e.g., via a sieve separation technique). Other processing techniques for separation can also be utilized such as electrostatic, centrifugal and/or cyclonic separation.

Still referring to FIG. 6, at 642, the pulverized/separated powder can then undergo vacuum annealing (sometimes referred to as vacuum baking).

In various embodiments described herein the term "vacuum annealing" means that anneal is conducted in oxygen-free ambient under a pressure lower than 101.3 kPa (atmosphere).

As described herein, this vacuum annealing prior to the hot pressing facilitates improved cross-sectional uniformity in the resulting target as compared, for example, to certain materials produced according to certain implementations of prior art U.S. Pat. No. 9,404,175. The improved cross-sectional uniformity facilitated by various embodiments can be with respect to electrical resistance and density (see, for example, FIG. 3, showing the cross-sectional uniformity of the visual appearance).

Still referring to FIG. 6, at 644, the vacuum-annealed product can be pulverized and separated (e.g., via a sieve separation technique). In one example, the vacuum annealing and then pulverizing/sieve separation can be repeated any number of times to obtain a desired result (e.g., until a desired resistance of material is achieved). Other processing techniques for separation can also be utilized such as electrostatic, centrifugal and/or cyclonic separation.

Still referring to FIG. 6, at 650, a sputtering target can be formed from the powder (i.e., that had undergone vacuum annealing) using a hot-press method. The temperature, pressure and duration of the hot-press method can vary and can be based on the powder and/or the desired sputtering target to be formed. For example, a BST sputtering target can undergo a hot-press at a temperature of 1000° C. to 2000° C. It should be understood that method 600 is but one example of a sputtering target that can be fabricated according to the embodiments, and the particular materials, temperatures, pressures, timing and so forth, can vary based on a number of factors including the desired sputtering target that is to be formed, a desired density of the sputtering target, and/or a desired deposition rate for the PVD process that will utilize the sputtering target. The exact fabrication method for the electrical components (e.g., capacitors) can be performed in various ways utilizing various sputtering target(s) described herein, such as described in the above referenced U.S. Pat. Nos. 8,154,850, 8,194,837, 7,224,040 (which are hereby incorporated by reference, and which have shown how to fabricate fixed and tunable capacitors using dielectric thin films deposited by the sputtering method).

Figure 7:
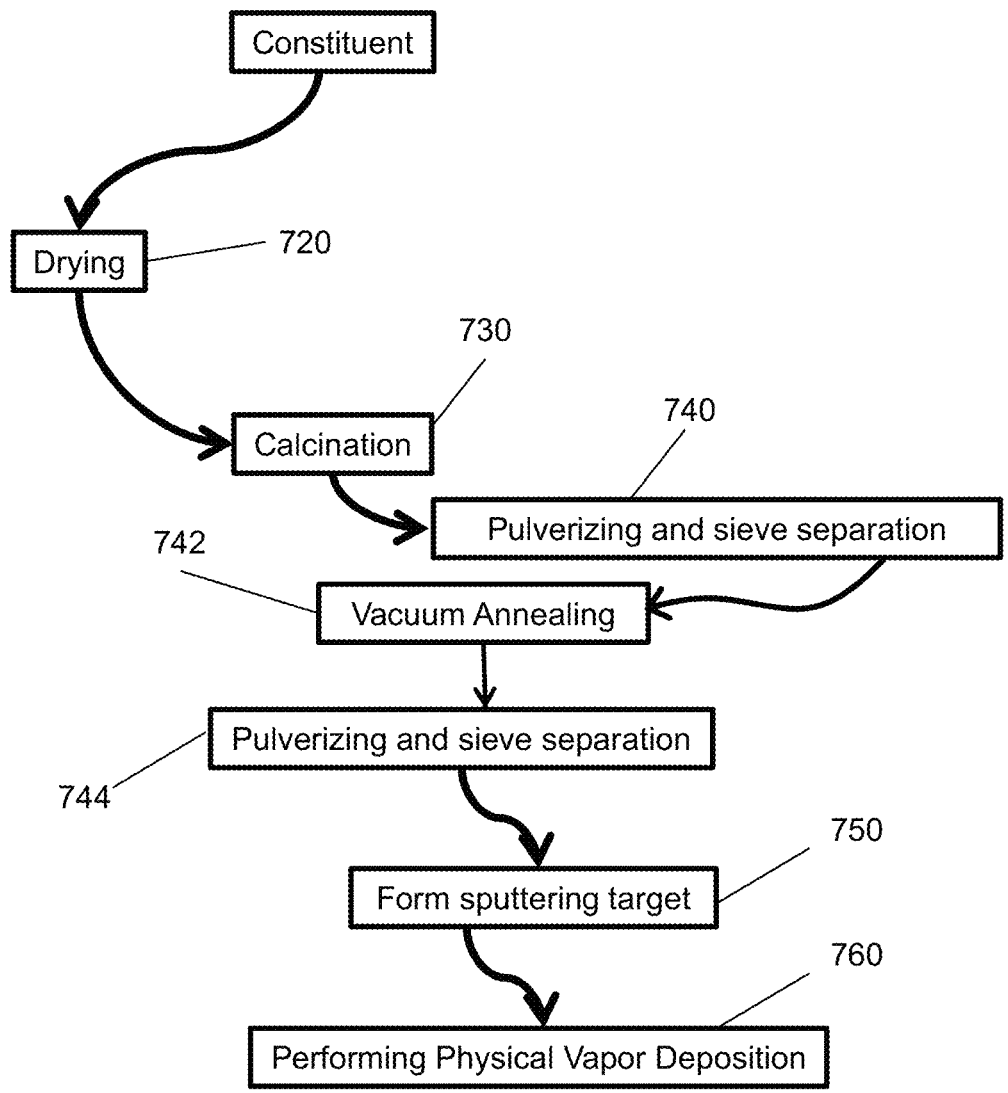
FIG. 7 depicts a method according to an embodiment that can be used (for example) for fabricating sputtering targets.

Reference will now be made to FIG. 7, in which a method 700 (according to an embodiment) is illustrated for fabricating a powder, forming a sputtering target from the powder, and performing physical vapor deposition. Method 700 is not intended to be limited to the steps illustrated in FIG. 7 and can include more or less steps than is depicted. As seen in this FIG. 7, step 720 is drying a constituent to provide a dried constituent (in one example, the constituent that is dried is Barium Titanate; in another example, the constituent that is dried is Strontium Titanate; in another example, the constituent that is dried is a combination of Barium Titanate and Strontium Titanate). Next, step 730 is calcining the dried constituent to provide a fully reacted constituent. Next, step 740 is pulverizing and separating the fully reacted constituent to provide a first powder. Next, step 742 is vacuum annealing the first powder to provide a vacuum annealed material. Next, step 744 is pulverizing and separating the vacuum annealed material to form a vacuum annealed powder material. Next, step 750 is hot-pressing the vacuum annealed powder material to form a target. Next, step 760 is performing physical vapor deposition using the target.

In various examples, the vacuum anneal process (such as at step 642 of FIG. 6 and/or step 742 of FIG. 7) can be applied to the fully oxidized (dielectric or insulating) powder in order to reduce it to sub-oxide state and achieve certain DC conductivity (reduce the resistance to a desired level).

One example of a vacuum anneal profile is as follows: The critical intervals of the temperature profile are dehydration and oxygen loss. The critical points are determined by Differential Thermal Analysis by the weight loss peaks. The critical intervals are determined by setting reasonable ranges around the critical points (for example, +/−20° C. or +/−50° C. from the critical points). The temperature ramp to the first critical interval is insignificant. The ramp to the second critical interval is as fast as the vacuum furnace is capable in order to minimize the crystal growth at that stage. Temperature plateau time is determined experimentally. The ramp down is not critical. Pumping speed should be maximal throughout the process and is limited by the equipment capability.

In one embodiment, the hot-pressing is performed at a temperature range of 1200° C. to 1500° C. and a highest temperature of the vacuum annealing is below 1200° C.

In various embodiments, the steps of vacuum bake (vacuum annealing) and subsequent pulverizing (and/or sieve separation) can be repeated any desired number of times in order to obtain the desired powder characteristics.

As described herein, various implementations of prior art U.S. Pat. No. 9,404,175 result in a low yielding process that can suffer from cracking of the target (such as resulting from oxygen evolution (or outgassing) and target sintering/densification occurring at the same time). In various implementations of prior art U.S. Pat. No. 9,404,175, the average resistance of the resulting target is 2-4 Ohm-meters which is sufficient for superimposed RF/DC sputtering. However, in various implementations of prior art U.S. Pat. No. 9,404,175, the bulk of target material has a non-uniform electrical resistance (having pieces with higher resistance spread in a low-resistance matrix). This can result in arcing during the sputtering process and device yield loss from excessive particles.

Various embodiments described herein modify a process of prior art U.S. Pat. No. 9,404,175 by at least adding a step of vacuum anneal (and subsequent milling) as follows: 1. Fabrication of the insulating powder—fabricate the insulating powder (for example) as per prior art U.S. Pat. No. 9,404,175; 2. Formation of the semiconducting powder—use a vacuum anneal step to reduce the insulating powder to a semiconducting state by thermal oxygen depletion (in various examples, the vacuum anneal conditions can be as follows: pressure of 1-100 Pa, temperature range of 900-1100° C.; in various examples, the vacuum anneal can be performed in a vacuum furnace; in various examples, alternative equipment providing the described conditions for the vacuum anneal could be used); 3. Milling of the resulting semiconducting material—the resulting semiconducting material can be milled to an optimal powder characteristic, e.g., particle size, size uniformity (in various examples, the milling step could be done with ball milling, rod milling or using other pulverizing techniques; in various examples, the majority of the oxygen depletion of the powder happens during this vacuum anneal step); 4. Target formation—target formation can result in high physical density (e.g., >99% of the theoretical density) and desired electrical conductivity (this can be achieved during target formation by a vacuum hot-pressing process; the vacuum hot press step can be used to further reduce the resistance of the dielectric material by continuing the oxygen depletion of the dielectric material as well as forming the target blank; in various examples, the hot press temperature range can be 1100-1500° C.). The hot pressing can form the target of the required density and can fine-tune the resistivity of the target material to the final requirement. In various examples, the resulting target material has high physical density, uniform 2-4 Ohm-meter resistance and enables a low-defect high throughput deposition process.

In one or more embodiments, the sputtering target provides dielectric films for thin-film capacitors which exhibit improved physical density, improved dielectric strength, high tuning, and improved uniformity of capacitance, breakdown voltage and thickness.

In various embodiments a method is provided for forming a target for deposition of doped dielectric films by sputtering.

In various embodiments a method is provided for forming a high quality semiconducting sputtering target suitable for a deposition process with superimposed RF and DC bias.

In various embodiments a method is provided for forming a high-density semiconducting sputtering target for dielectrics.

As described herein are various sputtering targets for tunable capacitors.

As described herein, various embodiments are directed to certain aspects of precursor powder fabrication details.

As described herein, in certain implementations of prior art U.S. Pat. No. 9,404,175 the hot pressing in the vacuum causes both chemical change of material and physical densification to occur during the hot pressing. In contrast, in various embodiments described herein, these two processes (chemical change of material and physical densification) are separated.

As described herein, in various embodiments (in order to obtain desired deposition rates of the PVD process), it can be necessary to superimpose RF and DC (low electrical resistance of the target can be a necessary condition since the insulating material is not conducting DC).

As described herein, in various embodiments an initially insulating oxide material can be reduced in vacuum (e.g., 1-1000 Pa) and at T (e.g., 800-1500° C.). In one specific example, 900° C. can be for Barium Strontium Titanate. In other examples, such as in the case of PZT, all the temperatures can be lower.

As described herein, various embodiments can provide for easier formation of sputtering targets, improved uniformity of sputtering targets and improved repeatability in the production of sputtering targets.

As described herein, in various embodiments the powder pre-hot press is already semiconducting.

As described herein, in various embodiments the resistance is uniformly low to start from.

Various embodiments can facilitate production of products in more economically efficient ways (e.g., higher "up" time of the sputtering equipment, higher target utilization, less scraped wafers, higher electrical yields of in-spec devices).

Various embodiments can facilitate production of targets with fewer defects in the deposited films, higher wafer probe electrical yields, etc.

Various embodiments can facilitate production of targets that will be cheaper to manufacture (since the yield of the target manufacturing process will be much higher).

Various embodiments can facilitate production of targets that will have uniform density and composition. This reduces the wafer-to-wafer variation and cost. It will also improve the within-wafer uniformity. This means that the product cost will be reduced, and the product will be less variable. This may allow products to be developed for applications which cannot be done with the conventional target. For example, a more uniform film composition and thickness may allow cost-effective fabrication of acoustic resonators with tight tolerances for low cost. The improved uniformity and composition reduce capacitance variation and might allow these capacitors to be used in precision applications without trimming, another cost reduction.

As described herein, various embodiments do not utilize constituent mixing (such as in the context of a doped and/or multi-oxide composition). Various embodiments can utilize any (or no) mixing technique.

One or more of the embodiments can be used for fabricating a sputtering target(s) used in a PVD sputtering process for producing dielectric layers of an electrical component (e.g., a voltage tunable variable capacitor), such as a high permittivity (High-K) dielectric perovskite or pyrochlore material of various stoichiometric or non-stoichiometric chemical compositions. The dielectric layers can be highly tunable. Examples include compounds containing Barium Strontium Titanium Oxide or $(BaSr)TiO_3$, SBT, SBM, PZT or PLZT, and doped formulations of each. Other electrically tunable dielectric materials may be used partially or entirely in place of BST. An example is strontium bismuth tantalate (SBT). Additional electronically tunable ferroelectrics can include other electrically tunable compositions of high-K dielectrics, such as $NaNO_3$, $KNbO_3$, $BaTiO_3$, $SrTiO_3$, $CaTiO_3$, members of the lead titanate family such as $PbTiO_3$, $Pb(Zr_xTi_{1-x})O_3$ (PZT), $(Pb,Sr)(Zr_xTi_{1-x})O_3$, $(Pb,La)(Zx Ti_{1-x})O_3$ (PLZT), niobate-tantalate family such as $LiTaO_3$, $PbNb_2O_6$, $KSr(NbO_3)$, $LiNbO_3$, $K(Ta_{1-x}Nbx)O_3$, $PbTa_2O_6 KDP$ ($KH_2PO_4$) layered perovskites/Aurivillius phases such as $SrBi_2Ta_2O_9$, tungsten-bronze structures ($PbTa_2O_6$), phosphates such as $KH_2PO_4$ (KDP), fluorides such as $BaMgF_4$ including doped formulations, and mixtures or compositions thereof.

In other embodiments, additional minor additives (e.g., in amounts of from about 0.1 to about 10 weight percent) can be utilized in the electrical component to additionally improve the electronic properties, such as of the films. These minor additives can include various materials, such as $CaZrO_3$, $BaZrO_3$, $SrZrO_3$, $BaSnO_3$, $CaSnO_3$, $MgSnO_3$, $Bi_2O_{3/2}SnO_2$, $Nd_2O_3$, $Pr_7O_{11}$, $Yb_2O_3$, $Ho_2O_3$, $La_2O_3$, $MgNb_2O_6$, $SrNb_2O_6$, $BaNb_2O_6$, $MgTa_2O_6$, $BaTa_2O_6$ and $Ta_2O_3$.

In one or more embodiments, films of tunable dielectric composites may comprise $Ba_{1-x}Sr_xTiO_3$ (BST) (or other tunable dielectric), in combination with at least one non-tunable dielectric phase including Group 2A elements in the form of oxide, silicate, zirconate, aluminate, tantalate, niobate or a mixture of thereof. Examples include MgO, $MgTiO_3$, $MgZrO_3$, $MgSrZrTiO_6$, $Mg_2SiO_4$, $MgAl_2O_4$, CaO, $CaSiO_3$, $CaTiO_3$, $BaSiO_3$ and $SrSiO_3$. The non-tunable dielectric phases may be any combination of the above, e.g., MgO combined with $MgTiO_3$, MgO combined with $MgSrZrTiO_6$, MgO combined with $Mg_2SiO_4$, MgO combined with $Mg_2SiO_4$, $Mg_2SiO_4$ combined with $CaTiO_3$. These compositions can be BST (or other tunable dielectric) and one of these components, or two or more of these components in quantities from 0.1 weight percent to 10 weight percent with BST (or other tunable dielectric) weight ratios of 99.9 weight percent to 90 weight percent.

In addition to Group 2A metals, one or more of the exemplary embodiments can utilize metal oxides, silicates, zirconates, aluminates, tantalates, niobates or a combination thereof that include metals from Group 1A (alkali metals), e.g., Li, Na, K and Rb. For instance, alkali metal silicates may include sodium silicates such as $Na_2SiO_3$ and $NaSiO_{3-5}$ H2O, and lithium-containing silicates such as $LiAlSiO_4$, $Li_2SiO_3$ and $Li_4SiO_4$. Metals from Groups 3A, 4A and some transition metals of the Periodic Table may also be suitable constituents of the metal silicate phase. Additional oxides and silicates may include but not limited to $Al_2O_3$, $SiO_2$, $ZrO_2$, $Al_2Si_2O_7$, $ZrSiO_4$, $KAlSi_2O_6$, $NaAlSi_2O_6$, $CaAl_2Si_2O_8$, $CaMgSi_2O_6$, $BaTiSi_3O_9$ and $Zn_2SiO_4$. Metals from other Groups of the Periodic Table may also be suitable constituents of the metal oxide phases. For example, oxides and/or other compounds of refractory metals such as Ti, V, Cr, Mn, Zr, Nb, Mo, Hf, Ta, and W may be used. Furthermore, metals such as Al, Si, Sn, Pb, and Bi may be used in the form of oxides and/or other compounds. In addition, the metal oxide phases may comprise rare earth elements such as La, Ce, Pr, Nd, Pm, Sm, Eu, Gd, Tb, Dy, Ho, Er, Tm, Yb, Lu in the form of oxides and/or other compounds solely or in composition with one or more of the above mentioned additives.

In one or more embodiments, high-capacity or tunable monolithic thin film capacitors can be formed from the doped oxide films deposited from the target. These integrated capacitors require electrode layers and/or interconnects formed, for example, from a conductive thin-film material (e.g., Pt, conductive oxides such as $SrRuO_3$, $LaNiO_3$, $LaMn_{1-x}Co_xO_3$, and other metals such as Ir, Au, Cu, and W). The electrode layers could be a single metal, or a multilayer structure comprised of two or more metals or combinations of metals with conductive oxides. These multilayer structures could include conductive barriers, such as but not limited to $Ti_xN_y$, TiW, $Ta_xN_y$, $Ta_x(ON)_y$, and anti-reflective layers.

Other uses for the invention include multi-component dielectric films deposited by the sputtering method for optical coatings and transparent conductive films for electro-optical devices or components.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, are contemplated by the subject disclosure.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method, comprising:
   determining temperature aspects of a vacuum anneal profile, wherein the temperature aspects comprise an oxygen loss critical interval and a temperature ramp to the oxygen loss critical interval, wherein the temperature aspects are determined by differential thermal analysis by weight loss peaks related to oxygen depletion, and wherein the temperature ramp is such as to minimize crystal growth;
   drying a constituent to provide a dried constituent;
   calcining the dried constituent to provide a fully reacted constituent;
   pulverizing and separating the fully reacted constituent to provide a first powder;
   vacuum annealing the first powder according to the vacuum anneal profile to provide a first vacuum annealed material, wherein the vacuum annealing of the first powder is performed without physical densification of the first powder, wherein a highest temperature of the vacuum annealing of the first powder is greater than 800° C., wherein the highest temperature of the vacuum annealing of the first powder is no greater than 900° C., and wherein the vacuum annealing of the first powder comprises a pressure of 1-100 Pa;
   pulverizing and separating the first vacuum annealed material to provide a first vacuum annealed powder material;
   vacuum annealing the first vacuum annealed powder material according to the vacuum anneal profile to provide a second vacuum annealed material, wherein the vacuum annealing of the first vacuum annealed powder material is performed without physical densification of the first vacuum annealed powder material, wherein a highest temperature of the vacuum annealing of the first vacuum annealed powder material is greater than 800° C., wherein the highest temperature of the vacuum annealing of the first vacuum annealed powder material is no greater than 900° C., and wherein the vacuum annealing of the first vacuum annealed powder material comprises the pressure of 1-100 Pa;
   pulverizing and separating the second vacuum annealed material to provide a second vacuum annealed powder material;
   hot-pressing the second vacuum annealed powder material to form a target; and
   performing physical vapor deposition using the target.

2. The method of claim 1, wherein the highest temperature of the vacuum annealing of the first powder is less than 900° C., wherein the highest temperature of the vacuum annealing of the first powder is below a lowest temperature of the hot-pressing, wherein the highest temperature of the vacuum annealing of first vacuum annealed powder material is less than 900° C., wherein the highest temperature of the vacuum annealing of the first vacuum annealed powder material is below the lowest temperature of the hot-pressing, and wherein the performing the physical vapor deposition using the target comprises performing the physical vapor deposition using the target to form a multicomponent dielectric thin film.

3. The method of claim 1, wherein the physical vapor deposition is performed at a deposition rate between nine nanometers per minute and eighteen nanometers per minute and wherein the target has a density of greater than 99% of a theoretical density.

4. The method of claim 1, wherein the hot-pressing is performed at a temperature range of about 1200° C. to about 1500° C.

5. The method of claim 1, wherein the method further comprises:
selecting a first major constituent, a second major constituent and at least one minor constituent, wherein the first major constituent is selected from a first group consisting essentially of $TiO_2$, $Ta_2O_5$, $Nb_2O_5$, or $ZrO_2$, wherein the second major constituent is selected from a second group consisting essentially of a carbonate, an acetate, an oxalate, a propionate or combinations thereof, and wherein the minor constituent is selected from a third group consisting essentially of a nanopowder, a gel, an alkoxide or combinations thereof; and
forming a mixture of constituents consisting essentially of the first major constituent, the second major constituent and the minor constituent in a single mixing step;
wherein the mixture of constituents is the constituent that is dried by the drying.

6. The method of claim 5, wherein the first major constituent is $TiO_2$.

7. The method of claim 5, wherein the first major constituent is $Ta_2O_5$.

8. The method of claim 5, wherein the first major constituent is $Nb_2O_5$.

9. The method of claim 5, wherein the first major constituent is $ZrO_2$.

10. The method of claim 5, wherein the second major constituent is $BaCO_3$.

11. The method of claim 5, wherein the second major constituent is $Pb(CH_3COO)_2$.

12. The method of claim 5, wherein the calcining is performed within 100° C. of a temperature of solid state reaction of each of the first major constituent, the second major constituent and the at least one minor constituent.

13. The method of claim 5, wherein the nanopowder is selected from a fourth group consisting essentially of a rare-earth metal oxide nanopowder, a hydroxide nanopowder, a titanate nanopowder, a zirconate nanopowder, a niobate nanopowder or combinations thereof, and wherein the alkoxide is selected from a fifth group consisting essentially of magnesium ethoxide, aluminum isopropoxide, rare-earth alkoxide, hydroxyacetate, hydroxyoxalate, hydroxypropionate or combinations thereof.

14. A method, comprising:
determining temperature aspects of a vacuum anneal profile, wherein the temperature aspects comprise an oxygen loss critical interval and a temperature ramp to the oxygen loss critical interval, wherein the temperature aspects are determined by differential thermal analysis by weight loss peaks related to oxygen depletion, and wherein the temperature ramp is such as to minimize crystal growth;
selecting a first major constituent, a second major constituent and at least one minor constituent, wherein the first major constituent is selected from a first group consisting essentially of $TiO_2$, $Ta_2O_5$, $Nb_2O_5$, or $ZrO_2$, wherein the second major constituent is selected from a second group consisting essentially of $BaCO_3$, $Pb(CH_3COO)_2$ or combinations thereof, and wherein the minor constituent is selected from a third group consisting essentially of a nanopowder, a gel, an alkoxide or combinations thereof;
forming a mixture of constituents consisting essentially of the first major constituent, the second major constituent and the minor constituent in a single mixing step;
drying the mixture of constituents to provide a dried mixture of constituents;
calcining the dried mixture of constituents to provide a fully reacted mixture of constituents;
pulverizing and separating the fully reacted mixture of constituents to provide a first powder of constituents;
vacuum annealing the first powder of constituents according to the vacuum anneal profile to provide a first vacuum annealed material, wherein the vacuum annealing of the first powder of constituents is performed without physical densification of the first powder of constituents, wherein a highest temperature of the vacuum annealing of the first powder of constituents is greater than 800° C., wherein the highest temperature of the vacuum annealing of the first powder of constituents is no greater than 900° C., and wherein the vacuum annealing of the first powder of constituents comprises a pressure of 1-100 Pa;
pulverizing and separating the first vacuum annealed material to provide a second powder of constituents;
vacuum annealing the second powder of constituents according to the vacuum anneal profile to provide a second vacuum annealed material, wherein the vacuum annealing of the second powder of constituents is performed without physical densification of the second powder of constituents, wherein a highest temperature of the vacuum annealing of the second powder of constituents is greater than 800° C., wherein the highest temperature of the vacuum annealing of the second powder of constituents is no greater than 900° C., and wherein the vacuum annealing of the second powder of constituents comprises the pressure of 1-100 Pa;
pulverizing and separating the second vacuum annealed material to provide a third powder of constituents;
hot-pressing the third powder of constituents to form a target; and
performing physical vapor deposition using the target to form a film, wherein the physical vapor deposition is performed at a deposition rate of at least twelve nanometers per minute, and wherein the target has a density of greater than 99% of a theoretical density.

15. The method of claim 14, wherein the hot-pressing is performed at a temperature range of 1200° C. to 1500° C.

16. The method of claim 14, wherein the nanopowder is selected from a fourth group consisting essentially of a rare-earth metal oxide nanopowder, a hydroxide nanopowder, a titanate nanopowder, a zirconate nanopowder, a niobate nanopowder or combinations thereof, and wherein the alkoxide is selected from a fifth group consisting essentially of magnesium ethoxide, aluminum isopropoxide, rare-earth alkoxide, hydroxyacetate, hydroxyoxalate, hydroxypropionate or combinations thereof.

17. A method, comprising:
determining temperature aspects of a vacuum anneal profile, wherein the temperature aspects comprise an oxygen loss critical interval and a temperature ramp to the oxygen loss critical interval, wherein the temperature aspects are determined by differential thermal analysis by weight loss peaks related to oxygen depletion, and wherein the temperature ramp is such as to minimize crystal growth;

selecting a first major constituent, a second major constituent and at least one minor constituent, wherein the first major constituent is selected from a first group consisting of $TiO_2$, $Ta_2O_5$, or $ZrO_2$, wherein the second major constituent is selected from a second group consisting essentially of a carbonate, an acetate, an oxalate, a propionate or combinations thereof, and wherein the minor constituent is selected from a third group consisting of a nanopowder, a gel, an alkoxide or combinations thereof;

forming a mixture of constituents consisting essentially of the first major constituent, the second major constituent and the minor constituent in a single mixing step;

drying the mixture of constituents to provide a dried mixture of constituents;

calcining the dried mixture of constituents to provide a fully reacted mixture of constituents;

pulverizing and separating the fully reacted mixture of constituents to provide a first powder of constituents;

vacuum annealing the first powder of constituents according to the vacuum anneal profile to provide a first vacuum annealed material, wherein the vacuum annealing of the first powder of constituents is performed without physical densification of the first powder of constituents, wherein a highest temperature of the vacuum annealing of the first powder of constituents is greater than 800° C., wherein the highest temperature of the vacuum annealing of the first powder of constituents is no greater than 900° C., and wherein the vacuum annealing of the first powder of constituents comprises a pressure of 1-100 Pa;

pulverizing and separating the first vacuum annealed material to provide a second powder of constituents;

vacuum annealing the second powder of constituents according to the vacuum anneal profile to provide a second vacuum annealed material, wherein the vacuum annealing of the second powder of constituents is performed without physical densification of the second powder of constituents, wherein a highest temperature of the vacuum annealing of the second powder of constituents is greater than 800° C., wherein the highest temperature of the vacuum annealing of the second powder of constituents is no greater than 900° C., and wherein the vacuum annealing of the second powder of constituents comprises the pressure of 1-100 Pa; and pulverizing and separating the second vacuum annealed material to provide a third powder of constituents.

18. The method of claim 17, further comprising hot-pressing the third powder of constituents to form a target.

19. The method of claim 18, further comprising performing physical vapor deposition using the target to form a dielectric thin film.

20. The method of claim 19, wherein the physical vapor deposition is performed at a deposition rate between nine nanometers per minute and eighteen nanometers per minute and wherein the target has a density of greater than 99% of a theoretical density.

\* \* \* \* \*